US006341083B1

(12) United States Patent
Wong

(10) Patent No.: US 6,341,083 B1
(45) Date of Patent: Jan. 22, 2002

(54) CMOS SRAM CELL WITH PFET PASSGATE DEVICES

(75) Inventor: Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/710,947

(22) Filed: Nov. 13, 2000

(51) Int. Cl.⁷ .............................................. G11C 11/00
(52) U.S. Cl. ........................................................ 365/154
(58) Field of Search ................................. 365/154, 156, 365/190, 207

(56) References Cited

U.S. PATENT DOCUMENTS

| | | | | |
|---|---|---|---|---|
| 4,253,162 A | * | 2/1981 | Hollingsworth | 365/175 |
| 4,333,166 A | * | 6/1982 | Edwards | 365/182 |
| 4,852,060 A | * | 7/1989 | Rockett, Jr. | 365/154 |
| 5,453,949 A | * | 9/1995 | Wiedmann et al. | 365/156 |
| 5,706,226 A | * | 1/1998 | Chan et al. | 365/156 |
| 5,747,979 A | | 5/1998 | Nagai | 323/349 |
| 5,754,468 A | * | 5/1998 | Hobson | 365/156 |
| 5,852,572 A | * | 12/1998 | Jung et al. | 365/154 |
| 5,892,712 A | * | 4/1999 | Hirose et al. | 365/185.07 |
| 6,030,548 A | | 2/2000 | Kuriyama | 252/368 |
| 6,040,991 A | | 3/2000 | Ellis-Monaghan et al. | 365/154 |
| 6,044,010 A | | 3/2000 | Deschene | 365/154 |
| 6,111,780 A | * | 8/2000 | Bertin | 365/154 |

OTHER PUBLICATIONS

K. Noda et al., "A 2.9 um2 Embedded SRAM Cell with Co–Salicide Direct–Strap Technology for 0.18 um High Performance CMOS Logic", IEDM 1997, pp 847–850. 07/97.

* cited by examiner

Primary Examiner—Richard Elms
Assistant Examiner—Anh Phung
(74) Attorney, Agent, or Firm—H. Daniel Schnurmann

(57) ABSTRACT

A CMOS SRAM cell provided with PFET devices as passgate transistors is described to reduce the surface area taken by the pull-up and pull-down devices. A six-transistor, single-port SRAM cell is shown to dissipate 75% less power when compared to conventional cells, and its cell stability improved by a factor of 2. The power saving is the result of the differential sensing made possible with the PFET passgate devices, the smaller standby off-current of the smaller devices and the smaller loading of the short bit lines. The overall SRAM cell is significantly smaller than conventional cells in view that all the six transistors take minimum dimensions. The cell stability is also improved by having the current leakage margin increased to $40\mu$ from a conventional cell current of 10 $\mu$a. In another aspect of the invention, an eight-transistor, dual-port cell, the more balanced proportion of 4 PFETs and 4 NFETs in the cell allows a surface area saving of 50% over a conventional layout of 2 PFETs and 6 NFETs. Power saving and stability improvements are also achieved by the PFET port.

10 Claims, 7 Drawing Sheets

PFET IO Access 6-T SRAM CELL 1.35 X 1.78 = 2.40 μm²
0.13μm CMOS

8SF 2 PORT SRAM CELL 8/8/00 BW
1.6 X 2.3 = 3.68 (1.49 X 2.47)

8SF DUAL-PORT SRAM CELL WITH PFET PORT
(ONE P-PORT AND ONE N-PORT)   8/8/00 BW
1.6 X 2.3 = 3.68 (1.49 X 2.47)

CONVENTIONAL 8T DUAL-PORT SRAM CELL
2.8 X 2.0 = 5.6 (2.27 X 2.47)
(LAYOUT OPTIMIZED TO 0.13 μm CMOS)

CMOS SRAM CELL WITH PFET PASSGATE DEVICES

FIELD OF THE INVENTION

The present invention is related to CMOS Static Random Access Memory (SRAM) devices, and more particularly, to an SRAM cell having P channel field-effect transistors a s passgate devices to significantly reduce the surface area of all the transistors forming the cell, to improve the cell stability, and to lower the power dissipated by the cell.

BACKGROUND AND PRIOR ART

Conventional CMOS SRAM cells typically consist of six transistors: two P channel field effect transistors (PFETs) for a pull-up operation, two N channel field effect transistors (NFETs) for pull down, and two NFETs for input/output (i.e., passgate) access. As shown in FIG. 1A, P1 and N1 form an inverter which is cross-coupled with another inverter consisting of P2 and N2. NL and NR are the passgate access devices which control reading from and writing into the cell. The corresponding layout for the above circuit is shown in FIG. 1B. The two pull-up PFETs P1 and P2 are referenced by numeral 102, the two pull down NFETs N1 and N2 by 111, and the passgate NFETs NL and NR by 101. For simplicity sake, metal shapes are not shown. In the particular layout, the word line (WL) is shown at first level metal M1 along the X-direction. The bit lines and the GND line are represented at the second level metal M2 along the Y-direction. Line 121 is the left bit line BL; line 122, the right bit line BR; and line 120, the vertical GND bus. The shape referenced by RX represents the active silicon area; PC, the polysilicon; CA, the contact from the first level metal M1 to PC or RX; and NW, the region for the N-well of the P-channel devices.

A conventional SRAM array consists of m rows and n columns of the aforementioned SRAM cells. Cells of the same row share one WL, while cells of the same column share the same bit line pair, consisting of BL and BR. The aforementioned design is used in many SRAMs, including, e.g., 1 Mega-bit memory having, typically, 1024 by 1024 cells.

During standby, all the WLs are at low (i.e., at GND level) and all bit lines are biased to the standby voltage level (of the power supply) Vdd. Thus, the NFET passgate devices NL and NR of all the cells are shut off. A data bit 1 is maintained with P1 and N2 on, and P2 and N1 off, such that the left cell node CL is at high (i.e., Vdd) while CR is at low (GND). Correspondingly, a data bit 0 is maintained when P2 and N1 are on, and P1 and N2 off, which forces the right cell node CR to high (i.e., Vdd) and the left node CL to GND. During access time, one WL is selected by being switched on (to Vdd) such that half of the PFET passgate devices along the selected WL are turned on simultaneously. For each cell along the selected WL, one passgate device is turned on.

During a read access operation, either BL or BR are pulled down from their high (at Vdd) by the cell. BL is pulled down if the cell is at 0, whereas BR is pulled down if the cell is at 1. A bit select multiplexor then steers the selected bit pair(s) to appropriate sense amplifiers to generate the digital signals for the external circuitry requesting the read memory operation. The sense signals developed along the unselected bit columns are ignored. The cells along the selected WL that were not selected are referred to as the 'half-selected' cells.

During a write access operation, the bit select circuitry steers the input data into the selected bit pairs. To write a 1, BL is driven to high (i.e., to Vdd) and BR to low (i.e., to GND), shutting off N1 and P2, while turning on N2 and P1. To write a 0, BL is forced to low and BR to high. Along the unselected bit columns, BL and BR are coupled to Vdd and are gradually pulled down by the 'half-selected' cells, as previously described in the read operation. Thus, during a read access operation, all the cells along the selected WL are disturbed since one NFET passgate device of each SRAM cell remains on. During a write access, all the 'half-selected' cells are similarly disturbed as during the read operation. When a cell is at 0, the left cell node CL is at GND. When WL is raised to high (i.e., Vdd), the passgate device NL switches on, raising BL to Vdd and pulling the left cell node up. Thus, NL and N1 act as a potential divider at CL between Vdd and GND. To prevent the node CL from rising beyond the threshold voltage of N2, the conductance of N1 must be larger than the conductance of NL. Otherwise, N2 turns on, pulling down the node CR, switching P1 on, and raising the node CL from GND to Vdd. In such an instance, the cell is disturbed from its 0 state to a 1 state.

Thus, the ratio of the conductance of N1 over the conductance of NL is a basic metric to measure the stability of the SRAM. This ratio is referred to by CMOS SRAM designers as 'beta' or 'beta ratio'. It is defined as the ratio of the conductance of the pull down device 111 over the conductance of passgate device 101.

There is no precise analytical expression for the conductance of the transistors. It is approximately proportional to m (pw/pl), wherein pl is the device channel length; pw, the device channel width and m, the effective carrier mobility. Accordingly, the beta of the cell can be approximated by the ratio of (m*pw/pl) of transistor N1 and (m*pw/pl) of NL. If N1 and NL have the same channel length, then the beta ratio becomes the ratio of the channel width of N1 over the channel width of NL. Referring back to FIG. 1B, the channel width of N1 is 0.36 $\mu$m, and the channel width of NL, 0.18 $\mu$m. Thus, the beta ratio equals 2. Depending on the SRAM application, beta ranges from 1.8 to 3. In general, beta needs to be bigger for faster operations.

Referring back to FIG. 1A, the six-transistor (6-T) cell shown therein has typically been the basic structure used in SRAM circuit designs, even though it is much larger than, e.g., a 1-T DRAM. Indeed, the cell size ratio between SRAM and DRAM generally exceeds 8. Many attempts have been made in the past to reduce the size of the SRAM cell. However, these attempts are routinely achieved by trade-offs between certain desirable feature characteristics of the 6-T SRAM cell. By way of example, in an article entitled "A 2.9 $\mu$m2 Embedded SRAM Cell with Co-salicide Direct-Strap Technology for 0.18 $\mu$m High Performance CMOS Logic", published in IEDM 97, pp 847–850, the cell size is reduced by removing the pull-up P channel FETs. This replacement introduces significant problems when the cell stability degrades and standby power dissipation increases. A cell read operation becomes destructive, and write back provisions must be introduced. As a result, the cycle time increases significantly and the access power becomes unacceptably large. Further, a standby pull-up current must also be provided to retain the cell data. Thus, the standby power becomes very significant.

In a second example, in U.S. Pat. No. 5,747,979, "High Density SRAM Circuit", issued Sep. 10, 1991, the pull-down NFET device is reduced to the same minimum size of the passgate device, without changing the NFET passgate device to a PFET passgate device. The area saving approaches those of the present invention. However, this reduction is attained at the expense of the cell beta degrading from 2 to 1. Thus, an array write back must be provided after every access, and no bit selection is possible. The cycle time needs to be stretched out and a considerable amount of extra power must be provided. Finally, the cells are still susceptible to disturbs, wherein the cells may have already flipped over before the sense signal is established for the subsequent write back. To minimize disturbing the less stable cells, data write back is provided after each access operation, as was required in the previous reference In another reference, U.S. Pat. No. 6,044,010, "Five Device SRAM Cell", issued Mar. 28, 2000, the cell size is reduced by removing one of the two passgate transfer devices. By doing so, the read operation is slowed down for lack of bit pair sensing. Writing is also difficult. Finally, the NFET passgate transfer device must be very large to overcome the internal N channel FET pull down when writing a 1. The cell size ends up being even larger to save one bit line wiring channel. The size of the passgate transfer device remaining in the 5-T SRAM cell can be reduced if the write operation consists of a preset step followed by a reset step. Then, the write time will be twice as long and a column deselect will still not be possible.

In U.S. Pat. No. 6,030,548, "SRAM Memory Device Having Reduced Size", issued Feb. 29, 2000, the cell size is reduced by introducing an extra layer of polysilicon runner to serve as the word line. The problems introduced are the extra cost of the more complicated process, and the inherent larger RC delays of the polysilicon wiring.

Besides the SRAM cell size, other considerations such as stability and power dissipation problems are emerging, as a result of technology down scaling. As the cells shrink in size, the cells are more prone to flipping because of cosmic rays and alpha particles. Accordingly, soft errors have dramatically increased with every new generation. Further, the off currents of the FET devices also increase exponentially because of the shortened channels. Thus, the SRAM cells become too hot and too unstable as the technology continues its scaling down progression by reducing the size of the cell with more advanced lithography and fabrication processes.

OBJECTS AND SUMMARY OF THE INVENTION

Accordingly, it is a primary object of the invention to provide an SRAM cell that is significantly cooler, more stable, and smaller in size, while still remaining within the technology design ground rules constraints, and without adding any additional process steps.

It is another object to replace the NFET passgate devices with PFET devices and guarantee an electrical conductivity ratio of 2 even though the physical channel size ratio is reduced to 1.

It is yet another object to provide an SRAM cell wherein the transistors forming the cell have a minimum size with no degradation of the cell stability.

It is still another object to significantly improve cell stability and reduce power dissipation.

It is a further object to significantly reduce the size of a dual-port SRAM cell, wherein one pair of passgate devices are PFETs and the other, NFETs, and still maintain high stability and low power dissipation associated with the PFET passgate devices.

It is yet a further object to minimize the size of the multi-port SRAM cell, wherein one-half of the passgate pairs are PFETs, and the remaining passgate device pairs are NFETs and still maintain higher stability and lower power dissipation associated with the PFET passgate devices.

These and other objects of the invention are achieved by an SRAM cell wherein by introducing PFET passgate devices, it is possible to reduce the total surface area of the pull-up and pull-down devices. In a first embodiment of invention, a 6-T, single-port SRAM cell dissipates less power than conventional devices by over 75%, the cell stability is improved by more than 2 times ,and the total cell size is reduced by at least 10%. The overall cell is significantly smaller since all the six transistors take minimum dimensions. The power saving is the result of a differential sensing made possible by the PFET passgate devices, by the smaller standby off-current of the smaller devices and by the smaller loading of the shorter bit lines. The cell stability is also improved by having the current leakage margin increased to 40 $\mu$a from a conventional current leakage margin of 10 $\mu$a.

In a second aspect of the invention, an eight-transistor (8-T), dual-port cell, the more balanced proportion of 4 PFETs and 4 NFETs of the cell allows a surface area saving of 50%, over a conventional layout of 2 PFETs and 6 NFETs. Power saving and stability improvement are also achieved with the PFET port. Disturbs through the NFET port remain the same as in conventional designs.

All these advantages are achieved while remaining within the same technology ground rule constraints, using the same basic process steps and layout ground rules.

Accordingly, there is provided a single-port SRAM cell formed by a first pair of P channel field effect transistors (PFET), each of the PFETs having a common source connected to a voltage potential and a gate connected to a drain of the other PFET; a pair of N channel field effect transistors (NFET), each of the NFETs having a drain connected to the drain of the respective PFET of the first pair of PFETs, a common source connected to ground, and a gate connected to the drain of an opposite PFET of the first pair of PFETs; a second pair of PFETs having the drain respectively connected to the connection linking the respective drain of the NFET of the pair of NFETs to the drain of the PFET of the first pair of PFETs;complementary bit lines, each of the bit lines respectively connected to the source of the PFET of the second pair of PFETs; and a word line connected to the gates of the PFETs of the second pair of PFETs.

It is further provided a dual-port SRAM cell formed by a first pair of PFETs, each of the PFETs having a common source connected to a voltage potential and a gate connected to a drain of the other PFET; a first pair of NFETs, each of the NFETs having a drain connected to the drain of the first pair of PFETs, a common source connected to ground and having a gate connected to the drain of an opposite PFET; a second pair of PFETs having a drain respectively connected to the connection linking the respective drain of the NFET of the first pair of NFETs and to the drain of the PFET of the first pair of PFETs; a second pair of NFETs having a drain respectively connected to the connection linking the respective drain of the PFET of the first pair of PFETs and to the drain of the NFET of the first pair of NFETs; a first pair of complementary bit lines respectively connected to a source of the PFET of the second pair of PFETs; a second pair of complementary bit lines respectively connected to a source of the NFET of the second pair of NFETs; a first word line connected to the gates of the PFETs of the second pair of PFETs; and a second word line connected to the gates of the NFETs of the second pair of NFETs.

BRIEF DESCRIPTION OF THE DRAWINGS

The accompanying drawings, which are incorporated in and which constitute a part of the specification, illustrate presently preferred embodiments of the invention and, together with the general description given above and the detailed description of the preferred embodiments given below, serve to explain the principles of the invention.

DETAILED DESCRIPTION OF THE INVENTION

Figure 1B:
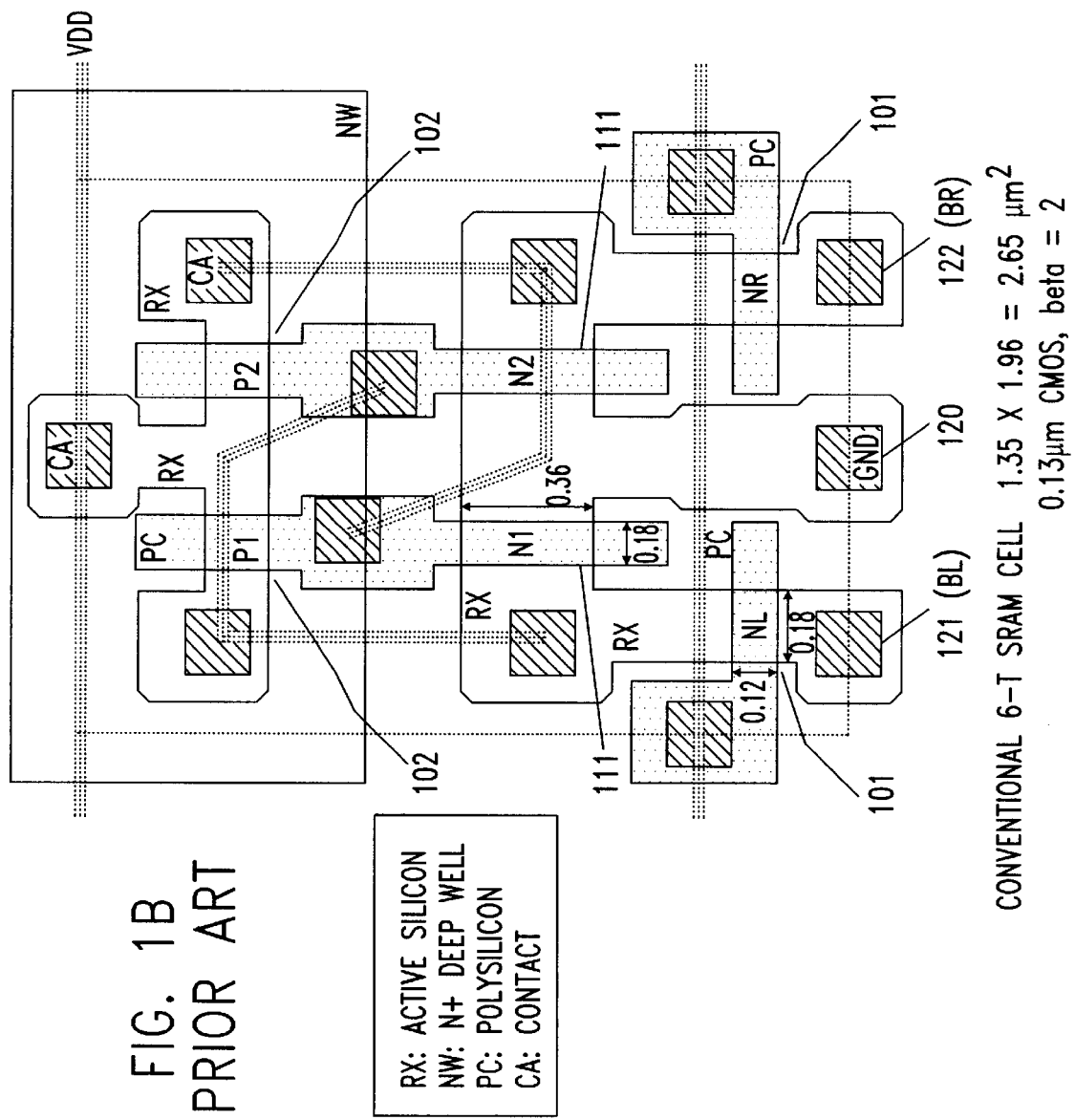
FIGS. 1A–1B show respectively, a schematic diagram of a prior conventional 6-T SRAM cell and its corresponding layout.
Figure 1A:
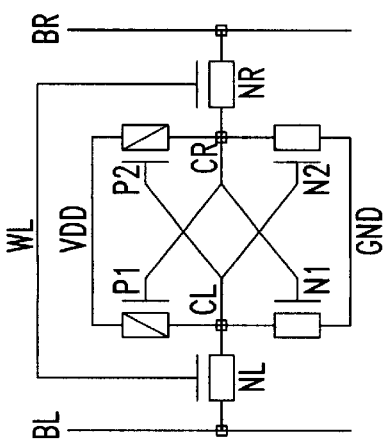
Figure 2B:
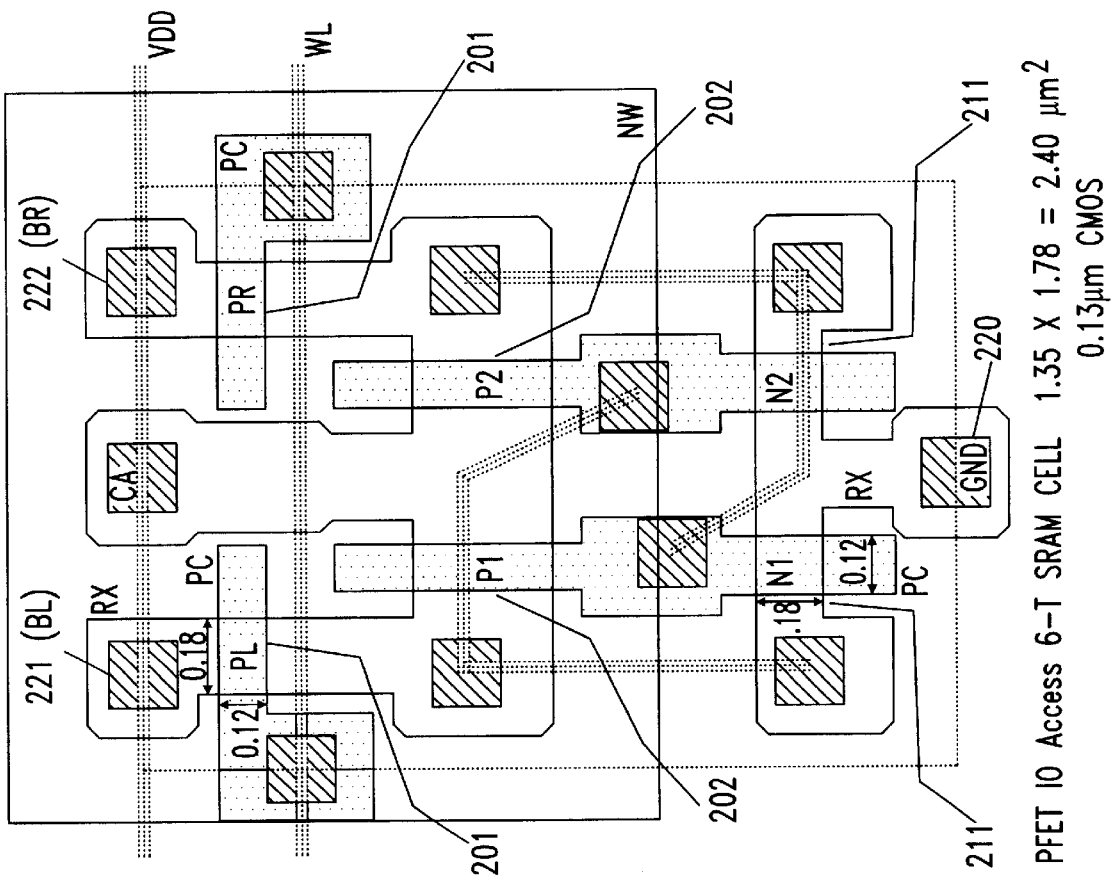
FIGS. 2A–2B show respectively, a schematic diagram of an SRAM cell having a P channel FET passgate device, in accordance with the present invention and its corresponding layout.
Figure 2A:
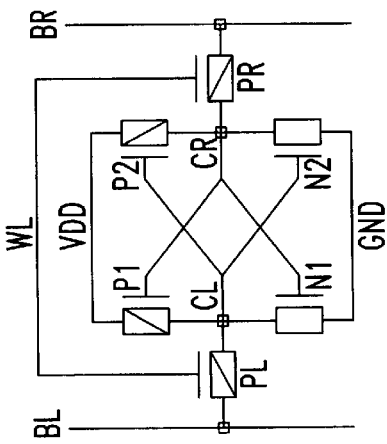

Referring to FIG. 2A, the SRAM cell of the present invention is shown having the NFET passgate devices NL and NR of FIG. 1A replaced with PFET devices PL and PR, respectively. The PFET pull-up devices are left unchanged, but the pull-down NFET devices N1 and N2 are now shrunk to the same minimum size of passgate devices PL and PR allowed by the groundrules of the technology. The operation of the SRAM cell according to the invention is as follows: the level of WL level is set to Vdd during standby, and to GND during access time. The bit line standby level remains at Vdd as in conventional designs, but it is preferably shifted to a level Vm, where 0<Vm<Vdd. A one-sided bit sensing scheme, typical of conventional designs can be used herein, although a two-sided differential sensing is preferable. The bit line standby level setting at Vm and the two-sided differential sensing offer a faster access and a lower power dissipation, which are not possible to achieve with a conventional design. (More details will be provided hereinafter with reference to FIG. 4).

FIG. 2B shows a layout corresponding to the circuit illustrated in FIG. 2A. The two pull-up PFET devices P1 and P2 are represented by numeral 202; the two pull-down NFETs N1 and N2, by 211; and the passgate PFETs PL and PR, by 201. As in FIG. 1B, the WL is depicted at the first level metal M1 along the X-direction. The bit lines and GND are shown at second level metal M2 along the Y-direction. The left bit line BL is represented by 221, the right bit line BR by 222, and the vertical GND bus by 220. The cell size is significantly smaller because of the shrinking of the pull-down NFET devices 211 (FIG. 2B). The width of the conventional SRAM cell is now reduced from 0.36 $\mu$m to 0.18 $\mu$m (as it may readily be seen by comparing 111 of FIG. 1B to 211 of FIG. 2B). This is the same minimum dimension of the passgate PFET devices, 201 (FIG. 2B). The overall area saving is about 10% (i.e., 2.65=1.104 times 2.40). Moreover, even though the pull-down device and the passgate device are of the same size, the conductance of the pull-down NFET is still about twice the conductance of the passgate PFET. The cell beta remains at about 2.

It is worth noting that when the key feature of the present invention is incorporated in the construction of the conventional cell shown in FIG. 1, its size may be further optimized by about 1% by stretching the NL channel length pl to 0.13 $\mu$m from 0.12 $\mu$m and by shrinking the N1 channel width pw to 0.33 $\mu$m from 0.36 $\mu$m, in order to maintain a cell beta of 2. The area saving when replacing the NFET passgate device with PFET devices approximates 9%. Generally, stretching the NL channel length pl is undesirable because the word line capacitance increases significantly. Likewise, the conventional cell layout of FIG. 1B can be further optimized by an additional 3% if the NL channel length pl is stretched to 0.21 $\mu$m and the N1 channel width pw is shrunk to 0.21 $\mu$m, in order to maintain the beta ratio at 2. The word line capacitance then increases by 75%. This tradeoff is clearly not acceptable since a bigger capacitance increases the power dissipation and slows the access time to the cell.

Referring to FIG. 2B, it was described in the Background and Prior Art that beta is approximated by the ratio of (m*pw/pl) of N1 over (m*pw/pl) of PL. Since the two devices are of the same size, beta becomes the ratio of m, or alternatively, the effective carrier mobility of NFET (i.e., the electron mobility) over that of the PFET (i.e., the hole mobility). This ratio is approximately equal to 2. (Note: the electrons in the NFET are about twice as mobile as the holes in the PFET).

As previously described, the beta ratio of an SRAM cell is commonly used to indicate the cell stability against disturbs. However, more precise metrics for the cell stability are the cell noise margins defined by the following four numbers:

Vnm0: noise margin for voltage disturb that forces a low voltage node up,

Vnm1: noise margin for voltage disturb that forces a high voltage node down,

Inmi: noise margin for current leakage into a low voltage node, and

Inmo: noise margin for current leakage out of a high voltage node.

It is observed that the weakest cell noise margin is Inmo. In a conventional SRAM design (e.g., having 0.13 $\mu$m groundrules), the tolerable leakage is only 10 $\mu$a, which may be further reduced to about 3 $\mu$a. under certain worst case conditions. Therefore, the PFET passgate cell of the invention is 4 times as stable as a conventional SRAM cell having the same beta ratio.

Figure 3:
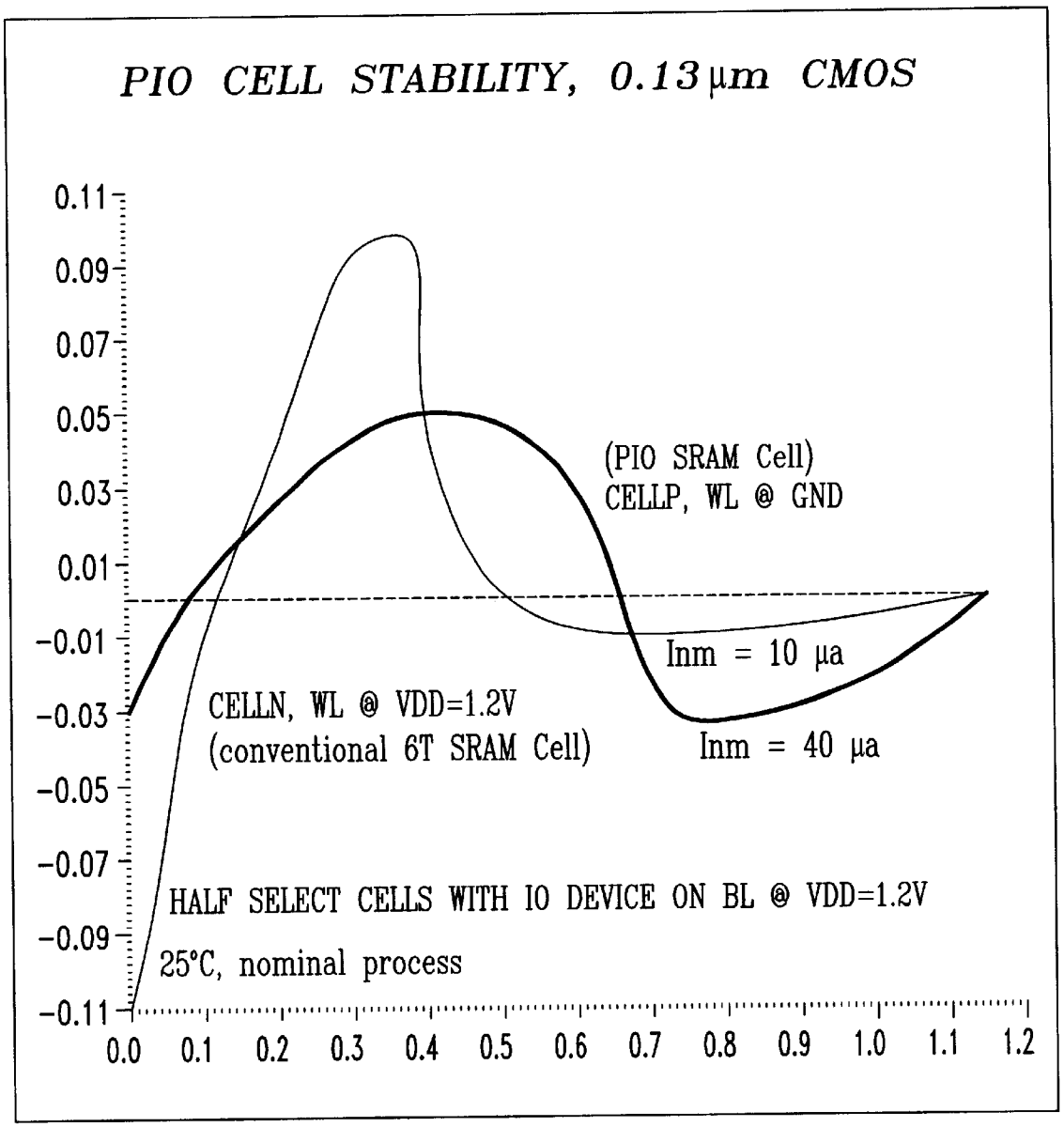
FIG. 3 illustrates a current vs. voltage (I-V) plot corresponding to the SRAM cell shown in FIG. 2.

Referring now to FIG. 3, the stability of the SRAM is characterized by an N-curve (also referred to as butterfly I-V plot) of the cell, wherein current through the voltage source is plotted against the voltage when the cell node is forced from GND to Vdd.

A cell is defined as DC stable if the current intercepts the current x-axis 3 times. The first intercept on the left represents the stable state of 0, and the third intercept on the right represents the stable state of 1. The voltage difference between the left intercept and the middle intercept represents the 0 voltage margin, while the difference between the right intercept and the middle intercept represents the 1 voltage margin. The maximum positive current between the first intercept and the middle intercept is the current margin for leakage into the cell, while the minimum current between the middle intercept and the third intercept is the current margin for leakage from the cell.

The PFET passgate device also allows a more flexible operation. In conventional SRAM designs, the bit lines are precharged to Vdd. Sensing is accomplished with one bit line being pulled down, while the other bit line stays at Vdd. Thus, sensing is a one-sided operation. With the P channel passgate cell of the present invention, sensing can be done in a truly differential manner. Bit lines are precharged to the aforementioned voltage level Vm. (Note: the exact value of Vm, 0<Vm<Vdd, is to be optimized for the particular technology.) Sensing is then accomplished with one bit line being pulled up, while the other bit line being pulled down. Differential sensing is advantageous over the conventional SRAM one-sided sensing for two reasons:

Power is reduced by three quarters, because a bit line restore is accomplished by equalizing the two bit lines back to Vm from the standby bias level. Since a read/write causes one bit line to move up and one bit line to move down, the restore equalization does not draw power from the power supply.

Sensing is faster by a factor of 2 (if two devices have the same conductivity) since the bit line moves now only half-way of the one-sided sensing. This truly differential sensing is not possible with conventional SRAM cells having NFET passgate devices. If the bit line standby voltage is not Vdd, the cell is prone to disturbs. If the bit line voltage is sufficiently low to start conducting current away from the cell, it can easily override the cell pull-up, causing it to flip. Moreover, the bit line pull-up by the cell is significantly weaker through NFET passgate devices. Thus, the bit line pull up time is much longer than its pull down time.

Figure 4:
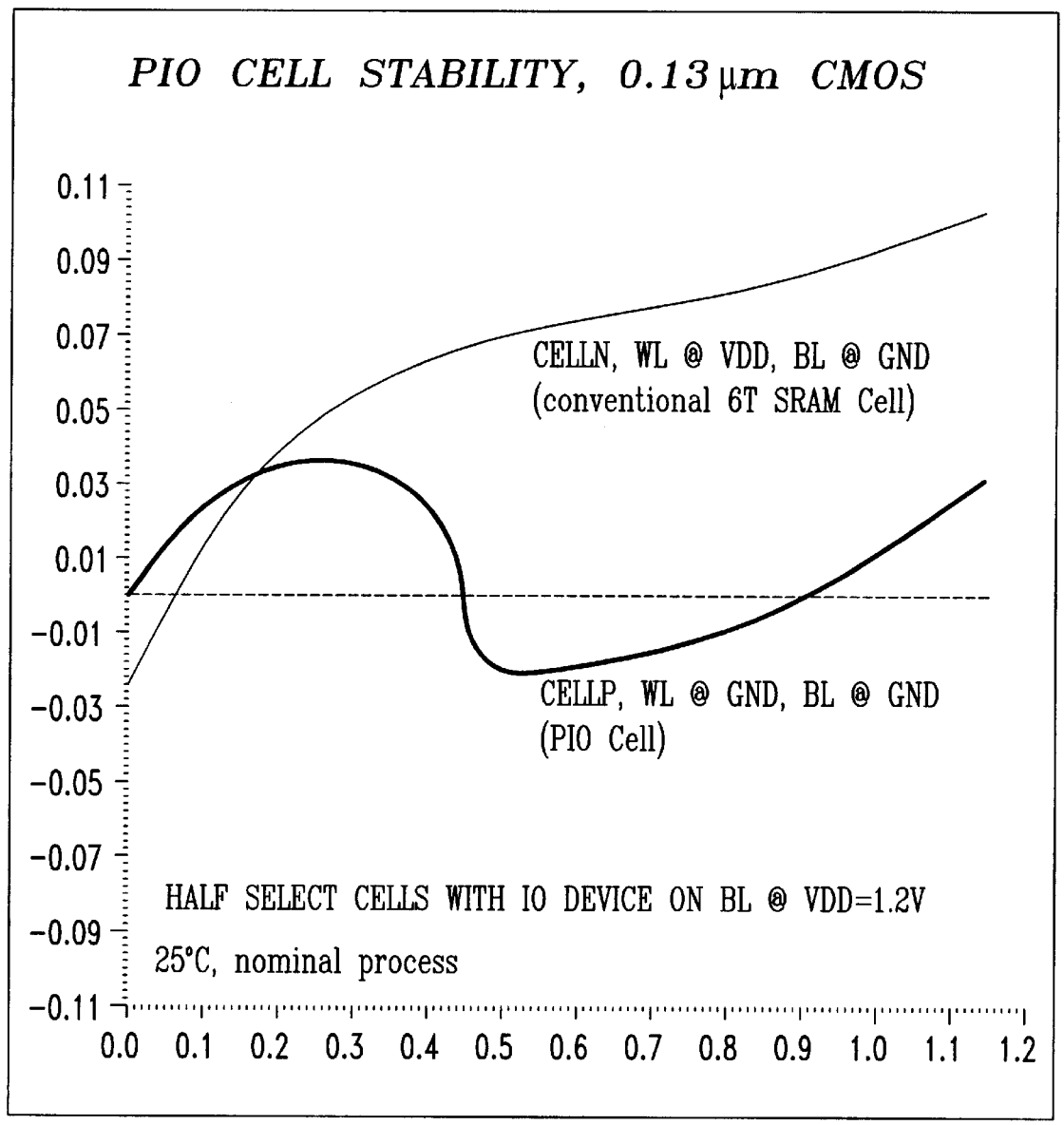
FIG. 4 is a second I-V plot of the SRAM cell shown in FIG. 2, with a GND bias on the bit lines.

Referring now to FIG. 4 showing an SRAM cell I-V plot with GND bias on the bit lines, when the bit lines are biased to GND, the conventional cells are reset to 0, while the P channel passgate cell remains stable with a considerable noise margin. The nominal threshold of bit line standby voltage for the conventional SRAM cell reaches minimum stability at about ½ Vdd for the SRAM shown in FIG. 1A, when the current crosses the x-axis at three points.

Generally, the smaller P channel passgate cell of FIG. 2 is slower than the conventional cell of FIG. 1. Although the differential sensing is twice as fast and the bit line loading 10% lighter, the conventional SRAM cell with bigger pull-down NFET devices still has a faster access. However, the P channel passgate cell can be made faster when constructed with bigger devices, while retaining the ½ power reduction and the faster differential sensing. The area saving in the single-port SRAM cell is approximately 10% when PFET passgate devices are used. The saving is mainly attributed to shrinking the pull-down NFET devices of the SRAM cell.

Complementary Dual-Port SRAM Cell with PFET and NFET Ports

Savings in area are even more pronounced in the case of multi-port SRAM cells This will now be illustrated by way of a dual-port SRAM cell, and more particularly, with a structure having one NFET port and one PFET port. The dual-port SRAM cells are more than twice as large as an equivalent single-port SRAM cell. Additionally, the 8-T, dual-Port SRAM cell with complementary passgate devices displays a stability enhancement and power saving of differential sensing which is only applicable only to the PFET port.

Dual-port SRAM cells have been successfully used in logic and memory designs, where multiple access to the same data are needed.

Figure 5B:
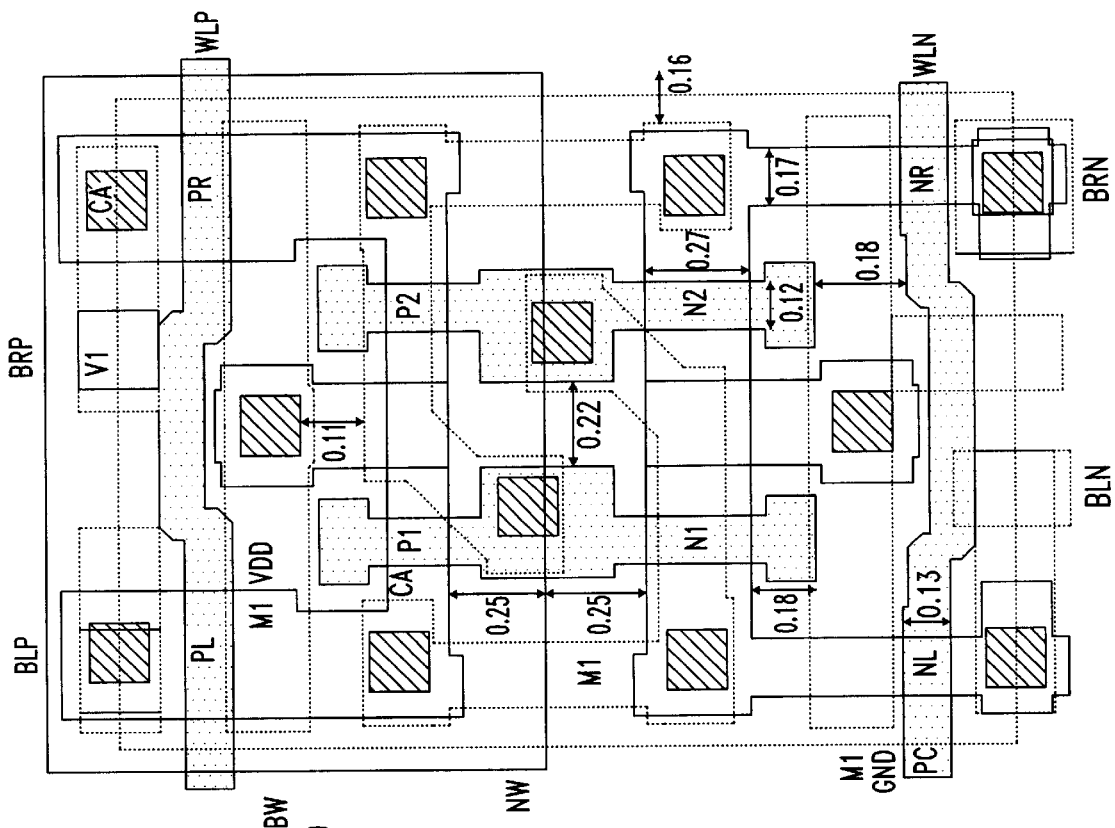
FIG. 5 shows an eight-transistor (8-T) 2-port SRAM cell with complementary passgate devices, according to a second embodiment of the invention.
Figure 5A:
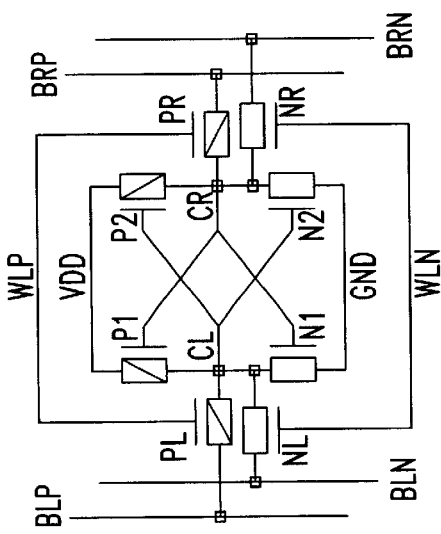

An 8-T dual-port SRAM cell according to the invention is shown in FIG. 5. It is designed with 0.13 μm CMOS generation ground rules, as used in the design of the single-port cell shown in FIG. 2.

A conventional 8-T dual-port SRAM cell is very similar to the conventional 6-T single-port SRAM cell, except for the additional pair of NFET passgate transistors, which serve as a second port to the cell data. The layout, however, is significantly different. Even though the device count ration is only 8:6, the cell size generally turns out to be 2:1 to 3:1. The conventional cell consists of 2 PFETs and 6 NFETs. The extra two NFETs need to be interconnected in a very congested area. Thus, over 100%–200% additional area is needed to accommodate the 30% additional devices.

The introduction of the PFET passgates to form the additional port provides significant relief to the topological congestion (see FIG. 5). The area saving with the complementary ports is about 50% (5.6=1.52×3.68)

Figure 6A:
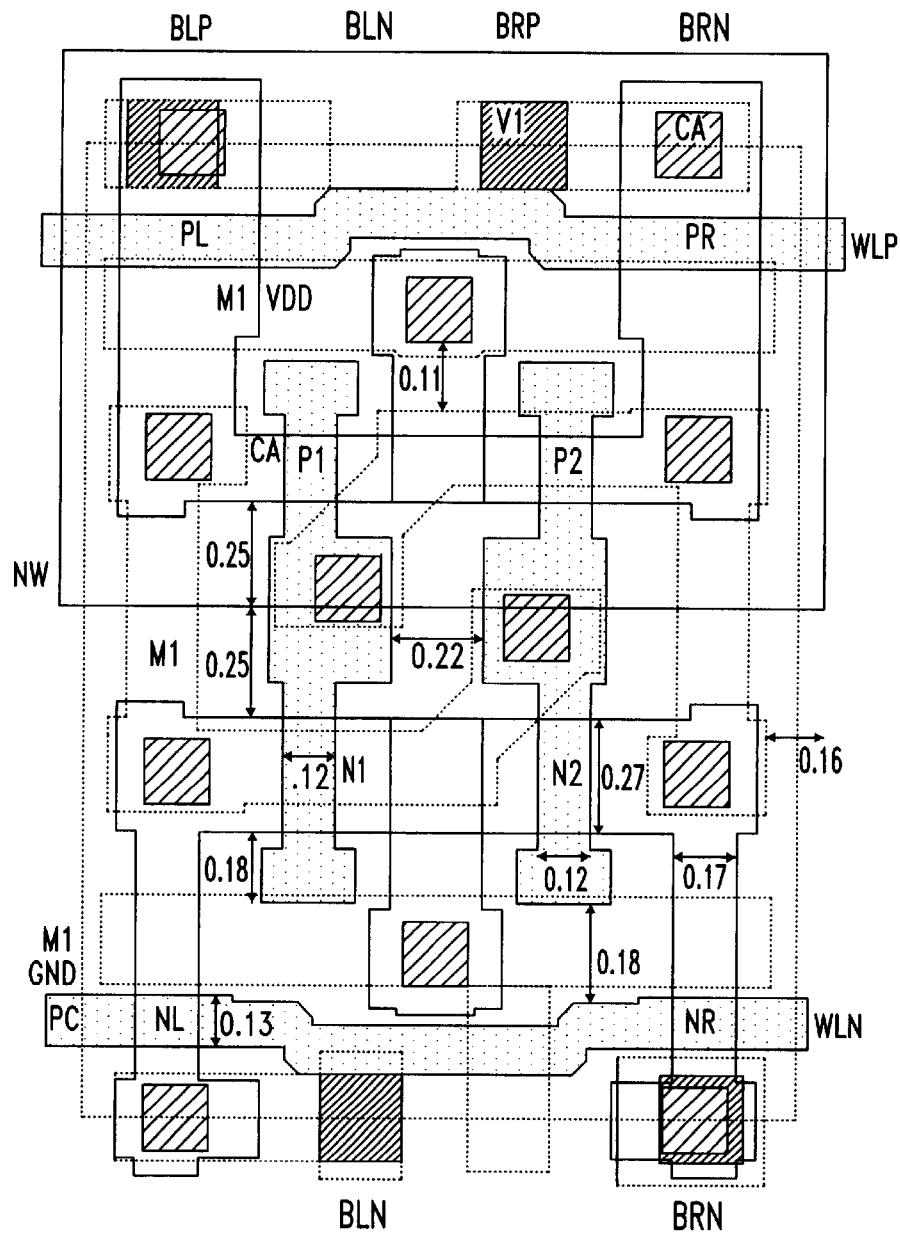
FIG. 6 shows two layouts side by side corresponding to an 8-T SRAM cell of the present invention (FIG. 6A) compared to a conventional 8-T SRAM cell (FIG. 6B).
Figure 6B:
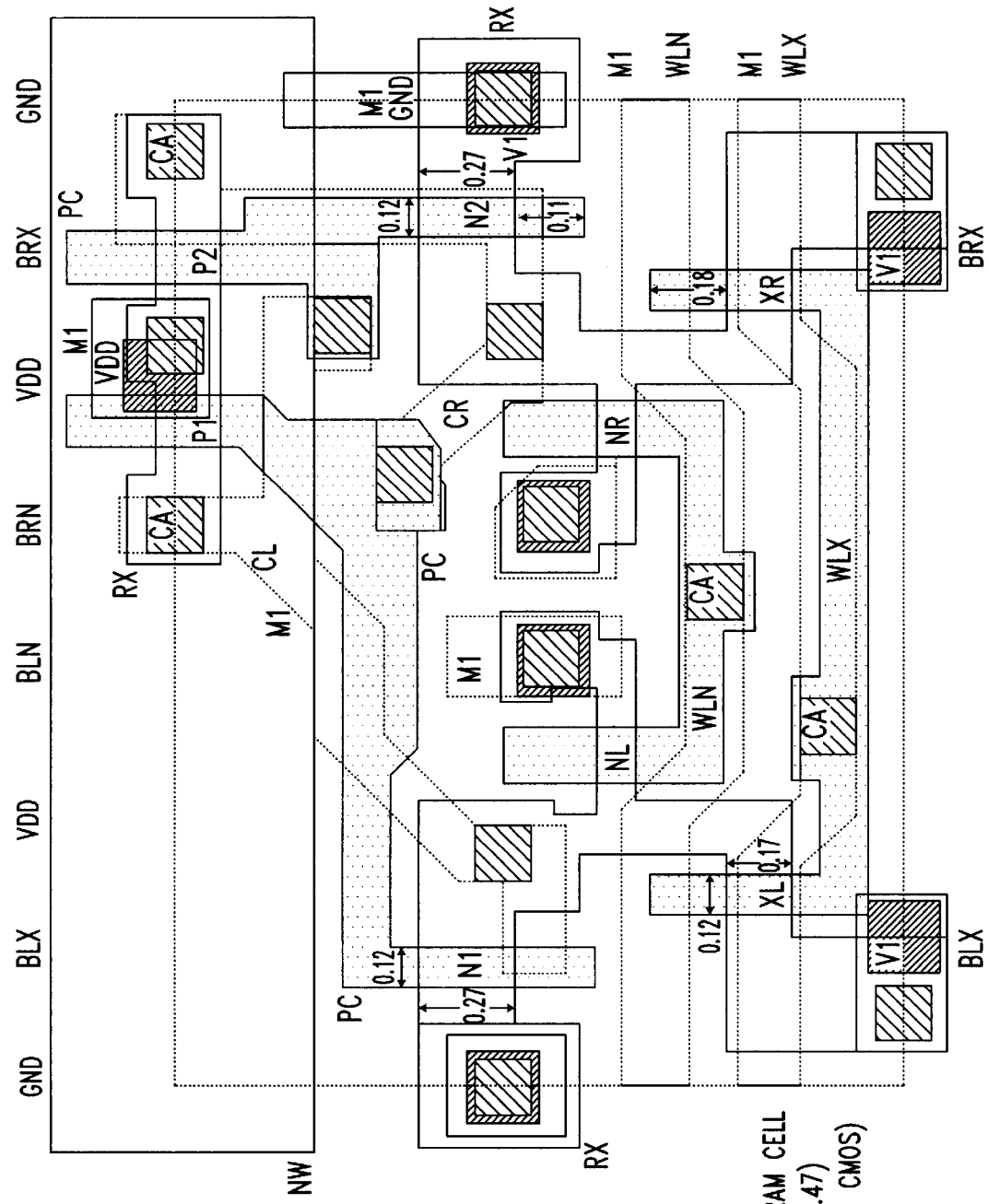

Referring now to FIG. 6, the layout of the inventive 8-T dual-port SRAM cell of FIG. 5 is compared to the conventional layout of an equivalent construction. The layout corresponding to the inventive SRAM cell has simpler shapes because the 4 NFETs and 4 PFETs fit together more precisely. The layout applicable to the conventional design must rely on complicated PC (polysilicon) and RX (active silicon) runners to form the interconnections. Complexity is always undesirable in integrated circuit designs since it degrades the yield and increases the cost of data handling.

The area taken by a dual-port SRAM is optimized with one NFET port and one PFET port. PFET passgate devices are used in both ports for stability purposes and for power saving. The cell size is larger, even though it is still smaller than the conventional layout with two NFET ports.

While several embodiments of the present invention have been shown and described, it is to be understood that various combinations, changes and modifications can be made without departing from the scope of the invention as defined in the appended claims.

Having now described various aspects of the invention. What is claimed is:

1. A one port static random access memory (SRAM) cell comprising:
   a first pair of P channel field effect transistors (PFET), each of the PFETs having a common source connected to a voltage potential and a gate connected to a drain of the other PFET;
   a pair of N channel field effect transistors (NFET), each of the NFETs having a drain connected to the drain of the respective PFET of the first pair of PFETs, a common source connected to ground, and a gate connected to the drain of an opposite PFET of the first pair of PFETs;
   a second pair of PFETs having the drain respectively connected to a connection linking the respective drain of the NFET of the pair of NFETs to the drain of the PFET of the first pair of PFETs, wherein the size of each of the PFETs is approximately the same as the size of each of the NFFTs;
   complementary bit lines, each of the bit lines respectively connected to the source of the PFET of the second pair of PFETs; and
   a word line connected to the gates of the PFETs of the second pair of PFETs.

2. The SRAM cell as recited in claim 1, wherein the conductivity of each of the NFETs is less than or equal to twice the conductivity of each PFET of the second pair of PFETs.

3. The SRAM cell as recited in claim 1, wherein the first pair of PFETs are pull up devices and the pair of NFETs are pull down devices.

4. The SRAM cell as recited in claim 1, wherein the first PFET of the first pair of PFETs and the first NFET of the pair of NFETs form a first inverter, and wherein the second PFET of the first pair of PFETs and the second NFET of the pair of NFETs form a second inverter, the first and second invertors being cross coupled to each other.

5. The SRAM cell as recited in claim 1, further comprising differential sensing means to provide a differential bit line access.

6. The SRAM cell as recited in claim 5, wherein the differential bit line access reduces the power dissipation by three-quarters.

7. The SRAM cell as recited in claim 1, wherein during a read operation one of the complementary bit lines is pulled up by the PFET devices of the first pair of the PFETs and the second bit line of the complementary bit lines is pulled down by the NFET devices of the pair of NFETs.

8. An array of SRAM cells formed by a plurality of one port SRAM cells arranged in an n by m matrix, wherein n and m are integers greater than 1, each of the SRAM cells forming the array comprising;

a first pair of PFETs, each of the PFETs having a common source connected to a voltage potential and a gate connected to a drain of the other PFET of the first pair of PFETs;

a pair of NFETs, each of the NFETs having the drain connected to the drain of the respective PFET of the first pair of PFETs, a common source connected to ground, and the gate connected to the drain of an opposite PFET of the first pair of PFETs;

a second pair of PFETs, each of the PFETs having the drain respectively connected to a connection linking the respective drain of the NFET of the pair of NFETs to the drain of the PFET of the first pair of PFETs, wherein the size of each of the PFETs is approximately the same as the size of each of the NFETs;

a pair of complementary bit lines, each of the cormplementary bit lines respectively connected to the source of the PFET of the second pair of PFETs; and word lines, each of the word lines connected to the gate of the PFET of the second pair of PFETs, the array further comprising:

n pairs of the complementeary bit lines, each pair of the complementaly bit lines linking respective sources of the PFETs of the second pair of PFEts of each of the SRAM cells to form columns of the array; and m word lines, each of the word lines linking respective gates of the PFETs of the second pair of PFETs of each of the SRWM cells to form columns of the array.

9. The array as recited in claim 8, wherein a standby condition is achieved by setting the bit lines of each complementary bit line pair to Vm, wherein 0<Vm<Vdd and by setting each of the word lines to the value of the voltage potential (Vdd).

10. The array as recited in claim 8, wherein following a read or write operation, the two complementary bit lines are equalized to the standby voltage Vm by way of an equalization transistor means after a selected word line is switched back to the standby voltage Vm and an active level of a selected word line is set to ground.

* * * * *